(12) United States Patent
Griebenow et al.

(10) Patent No.: US 8,508,008 B2
(45) Date of Patent: Aug. 13, 2013

(54) OPTICAL SIGNAL TRANSFER IN A SEMICONDUCTOR DEVICE BY USING MONOLITHIC OPTO-ELECTRONIC COMPONENTS

(75) Inventors: Uwe Griebenow, Markkleeberg (DE); Sven Beyer, Dresden (DE); Thilo Sheiper, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 429 days.

(21) Appl. No.: 12/893,329

(22) Filed: Sep. 29, 2010

(65) Prior Publication Data
US 2011/0073875 A1  Mar. 31, 2011

(30) Foreign Application Priority Data
Sep. 30, 2009  (DE) .................... 10 2009 047 873

(51) Int. Cl.
*H01L 27/14* (2006.01)
(52) U.S. Cl.
USPC ...... 257/431; 257/98; 257/432; 257/E31.127; 438/31; 438/69
(58) Field of Classification Search
None
See application file for complete search history.

(56) References Cited

U.S. PATENT DOCUMENTS

| 4,966,430 | A | 10/1990 | Weidel | 350/96.11 |
|---|---|---|---|---|
| 5,987,196 | A | 11/1999 | Noble | 385/14 |
| 6,806,111 | B1 | 10/2004 | Ehrichs et al. | 438/29 |
| 2005/0054131 | A1* | 3/2005 | Wada et al. | 438/31 |
| 2006/0105563 | A1* | 5/2006 | Zia et al. | 438/622 |
| 2007/0080414 | A1* | 4/2007 | Bjorkman et al. | 257/432 |
| 2008/0181557 | A1* | 7/2008 | Wang et al. | 385/14 |

FOREIGN PATENT DOCUMENTS

DE  3834335 A1  4/1990

OTHER PUBLICATIONS

Translation of Official Communication from German Patent Office for German Patent Application No. 10 2009 047 873.6 dated Jul. 16, 2012.

* cited by examiner

*Primary Examiner* — Tan N Tran
*Assistant Examiner* — Scott R Wilson
(74) *Attorney, Agent, or Firm* — Williams, Morgan & Amerson, P.C.

(57) ABSTRACT

In a semiconductor device, optical signal transfer capabilities are implemented on the basis of silicon-based monolithic opto-electronic components in combination with an appropriate waveguide. Thus, in complex circuitries, such as microprocessors and the like, superior performance may be obtained in terms of signal propagation delay, while at the same time thermal requirements may be less critical.

17 Claims, 7 Drawing Sheets

OPTICAL SIGNAL TRANSFER IN A SEMICONDUCTOR DEVICE BY USING MONOLITHIC OPTO-ELECTRONIC COMPONENTS

BACKGROUND OF THE INVENTION

1. Field of the Invention

The present disclosure generally relates to the field of fabricating integrated circuits, and, more particularly, to interconnect structures for signal exchange in complex integrated circuits.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are continuously decreased with the introduction of every new circuit generation, to provide currently available integrated circuits formed by volume production techniques with critical dimensions of 50 nm or less and having an improved degree of performance in terms of speed and/or power consumption. A reduction in size of transistors is an important aspect in steadily improving device performance of complex integrated circuits, such as CPUs. The reduction in size is commonly associated with an increased switching speed, thereby enhancing signal processing performance at transistor level.

In addition to the large number of transistor elements, a plurality of passive circuit elements, such as capacitors, resistors, interconnect structures and the like, are typically formed in integrated circuits as required by the basic circuit layout. Due to the decreased dimensions of the active circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC).

Although, in highly complex integrated circuits, transistor elements are the dominant circuit element which substantially determine the overall performance of these devices, other components, such as capacitors and resistors and, in particular, a complex interconnect system or metallization system, may be required, wherein the size of these passive circuit elements may also have to be adjusted with respect to the scaling of the transistor elements in order to not unduly consume valuable chip area.

Typically, as the number of circuit elements, such as transistors and the like, per unit area may increase in the device level of a corresponding semiconductor device, the number of electrical connections associated with the circuit elements in the device level may also be increased, typically even in an over-proportional manner, thereby requiring complex interconnect structures which may be provided in the form of metallization systems including a plurality of stacked metallization layers. In these metallization layers, metal lines, providing the inner level electrical connection, and vias, providing intra level connections, may be formed on the basis of highly conductive metals, such as copper and the like, in combination with appropriate dielectric materials, so as to reduce the parasitic RC (resistive capacitive) time constants, since, in sophisticated semiconductor devices, typically, signal propagation delay may be substantially restricted by the metallization system rather than the transistor elements in the device level. However, expanding the metallization system in the height dimension so as to provide the desired density of interconnect structures may be restricted by the parasitic RC time constants, the limitations imposed by the material characteristics of sophisticated low-k dielectrics and the heat dissipation capability. That is, typically, a reduced dielectric constant is associated with reduced mechanical stability of these dielectric materials, thereby also restricting the number of metallization layers that may be stacked on top of each other in view of yield losses during the various fabrication steps and the reduced reliability during operation of the semiconductor device. Moreover, the increasing current density in the metal line, in combination with increased waste heat produced in the device level, may require a superior heat conductivity, which may not be compatible with a high packing density of metal lines and a reduced dielectric constant of the dielectric materials of the metallization system.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the present disclosure provides semiconductor devices and manufacturing techniques in which silicon-based opto-electronic components, i.e., light-emitting elements and light-receiving elements, may be used for a device-internal signal exchange and, in some illustrative embodiments, for the chip-internal signal exchange. As previously explained, the increasing complexity of metallization systems and interconnect systems of complex integrated circuits impose significant restrictions on the finally obtained device performance, for instance with respect to the thermal budget, operating speed, adaptation of circuit portions of different supply voltage and the like. For this reason, the present disclosure provides semiconductor devices in which optical signal transfer capabilities may be provided within integrated circuit devices or even within a single semiconductor chip by using monolithically implemented opto-electronic components. For this purpose, silicon-based light-emitting devices, for instance based on dislocation loops and any other intentionally generated modifications of the silicon base material, may be advantageously implemented during the process sequence for forming circuit elements of a complex circuit, such as a microprocessor and the like, in order to implement the functionality of converting electrical signals into optical signals and visa versa. Furthermore, appropriate optical communication paths, such as waveguides and the like, may be implemented in order to operatively connect different circuit elements via the optical signal transfer. In some illustrative aspects, an optical communication path may be provided in the form of a semiconductor-based waveguide, which may be formed on the basis of manufacturing techniques that may not unduly contribute to an increased overall process complexity. In other illustrative aspects disclosed herein, the optical signal exchange capabilities based on monolithically implemented opto-electronic components may be used for an inter-chip communication of a three-dimensional integrated circuit device, thereby providing superior design flexibility and also enhanced overall device performance. Thus, an efficient signal exchange may be accomplished on the basis of monolithically implemented opto-electronic components, thereby relaxing any constraints with respect to the thermal budget, while at the same time allowing enhanced design flexibility. Furthermore, a superior overall device performance may be obtained due to superior signal propagation speeds on the basis of an electrically decoupled communication path.

One illustrative semiconductor device disclosed herein comprises a first circuit element formed in and above a first silicon-containing semiconductor region. The semiconductor device further comprises a second circuit element formed in and above a second silicon-containing semiconductor region. Moreover, a light-emitting element is formed in a third silicon-containing semiconductor region and a light-receiving element is formed in a fourth silicon-containing semiconductor region. The light-receiving element is configured and arranged to receive light from the light-emitting element. Moreover, the semiconductor device comprises an interconnect structure that is configured to electrically connect the light-emitting element with the first circuit element and to electrically connect the light-receiving element with the second circuit element.

A further illustrative semiconductor device disclosed herein comprises a plurality of circuit elements formed in and above a first silicon-containing semiconductor layer. Furthermore, the semiconductor device comprises a light-emitting element formed in a second silicon-containing semiconductor layer, wherein the first silicon-containing semiconductor layer is formed above the second silicon-containing semiconductor layer. Additionally, the device comprises a light-receiving element formed in the second silicon-containing semiconductor layer. Furthermore, a first buried cladding layer is formed between the first and second silicon-containing semiconductor layers and a second buried cladding layer is formed below the second silicon-containing semiconductor layer. Additionally, the semiconductor device comprises an interconnect system that is configured to electrically connect the light-emitting element and the light-receiving element with the plurality of circuit elements.

One illustrative method disclosed herein relates to forming a silicon-based semiconductor device. The method comprises forming a first circuit element in a first silicon-containing semiconductor region and forming a second circuit element in a second silicon-containing semiconductor region. The method additionally comprises forming a light-emitting element in a third silicon-containing semiconductor region and forming a light-receiving element in a fourth silicon-containing semiconductor region. Additionally, the method comprises providing an optical path between the light-emitting element and the light-receiving element.

BRIEF DESCRIPTION OF THE DRAWINGS

The disclosure may be understood by reference to the following description taken in conjunction with the accompanying drawings, in which like reference numerals identify like elements, and in which.

Figure 1A:
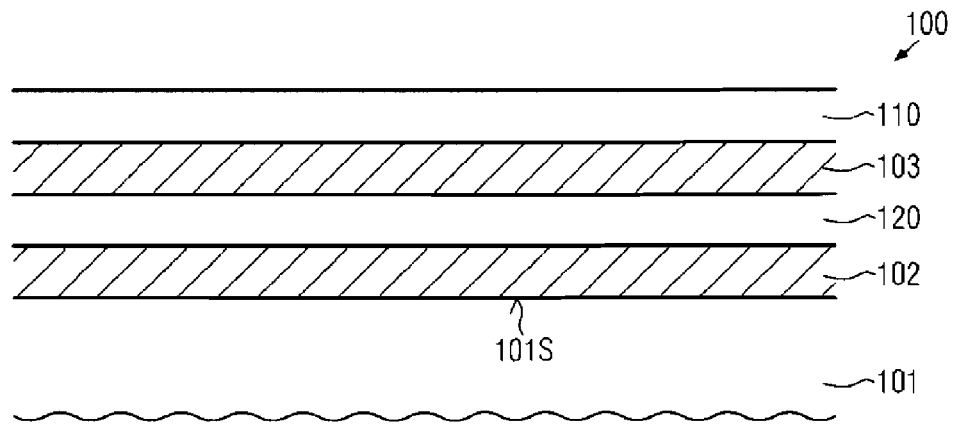
FIGS. 1a-1j schematically illustrate cross-sectional views of a semiconductor device during various manufacturing stages in implementing optical signal exchange capabilities into a semiconductor device on the basis of monolithically implemented opto-electronic components in a silicon base material, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which silicon-based opto-electronic components, such as light-emitting elements and light-receiving elements, may be used for optical signal exchange between circuit elements of a complex circuit, such as a microprocessor and the like. For this purpose, the silicon opto-electronic components may be fabricated on the basis of materials and manufacturing strategies as are also applied for forming the actual circuit elements, thereby not unduly contributing to an increased overall process complexity. At the same time, the optical signal exchange capabilities obtained on the basis of monolithically implemented opto-electronic components may significantly extend functionality and performance of silicon-based semiconductor devices, for instance in terms of band width and signal propagation speed, compared to conventional interconnect structures and metallization systems. Furthermore, due to the capability of transferring signals via an optical communication path in silicon-based semiconductor devices over any required distances without deteriorating operating speed, superior design flexibility may be accomplished, for instance in terms of more efficiently distributing critical circuit portions, which may contribute to a significant amount of waste heat during operation of the device. Furthermore, the heat generation in the metallization system itself may be significantly reduced compared to a conventional metallization system that has to provide the same signal exchange capability. Furthermore, since efficient waveguide branches may be obtained on the basis of silicon-based materials, such as silicon, silicon dioxide, silicon nitride and the like, a desired degree of complexity of the optical communication system may be established within a single semiconductor chip or within various semiconductor chips of a single three-dimensional chip configuration. For example, device regions, such as a substrate portion and the like, may be efficiently used for optical signal transfer, substantially without requiring additional floor space in the semiconductor chip. In other cases, complex voltage adaptation stages may be reduced in number and/or complexity, since signals may be exchanged via the optical communication system irrespective of the actual potential of the corresponding circuit portions.

As indicated above, sensitive light-receiving elements, such as photodiodes and the like, may be readily implemented in a silicon-based material, for instance, on the basis of silicon/silicon-germanium heterostructures, which may represent efficient and fast converters for converting an optical signal into an electrical signal. Furthermore, recently, light-emitting diodes have been developed which provide appropriate intensity to establish an efficient signal transfer along distances as may typically occur in integrated circuits and single chip devices. For instance, in a crystalline silicon base material, crystal defects may intentionally be introduced, for instance in the form of dislocation loops and the like, wherein the strain component in the environment of the disturbed silicon crystal may result in an increased probability for the occurrence of radiative electron-hole recombination events. Appropriate dislocation loops or other crystal modifications may be readily obtained on the basis of established process techniques, such as implantation of a boron species, in combination with an appropriate heat treatment, in order to obtain the desired size and density of dislocation based crystallographic irregularities. Consequently, such semiconductor areas may be implemented at any appropriate position within a silicon-based semiconductor layer and may then be optically coupled to a light-receiving element, which may be accomplished by providing an appropriate optical path, for instance, a waveguide, by using appropriate materials, such as a core material having a higher index of refraction compared to a "cladding" material having a lower index of refraction. For instance, silicon material is transparent in the near infrared wavelength range, for instance at approximately 1 µm, at an index of refraction of approximately 4. Hence, materials, such as silicon dioxide, silicon nitride, silicon oxynitride and the like, may be efficiently used as a cladding material due to a lesser index of refraction. In other cases, different dielectric materials having a different index of refraction may be used as core and cladding material of a corresponding waveguide, when the provision of a semiconductor-based core material of a waveguide is considered inappropriate. In some illustrative embodiments, the optical path between the light-emitting element and the light-receiving element may be established within the same silicon-based semiconductor layer, thereby achieving an efficient coupling of the opto-electronic components with the optical path connecting these two opto-electronic components. Such a configuration may also be referred to as a two-dimensional configuration, since the same silicon base layer may be used for the opto-electronic components and the optical path. In other illustrative embodiments, a "three-dimensional" configuration may be used, when the opto-electronic components may be formed in different silicon-based semiconductor materials, which may be connected in a later manufacturing stage, for instance by wafer bond techniques and the like. Furthermore, in three-dimensional configurations and also in two-dimensional configurations, the optical waveguide may have different waveguide branches that may be coupled to each other by appropriately designed deflecting areas, when a change of the general propagation direction of the optical signal is required. For this purpose, mirror-like components, Bragg gratings and the like may be readily implemented into the respective waveguide sections.

It should be appreciated that, in the context of the present application, the term "light" is to be understood as indicating electromagnetic radiation including the wavelength range from infrared to the visible light and into the near ultraviolet wavelength range. Consequently, electromagnetic radiation having a wavelength of, for example, 10 µm to 300 nm, may be referred to as "the light."

With reference to the accompanying drawings, further illustrative embodiments will now be described in more detail, wherein FIGS. 1a-1j may refer to embodiments in which the monolithically implemented opto-electronic components and the optical path may be established within a common silicon-based semiconductor material. On the other hand, FIG. 1l may refer to embodiments in which the opto-electronic components may be formed in silicon-based materials of different substrates, which may be bonded in a separate manufacturing process.

FIG. 1a schematically illustrates a cross-sectional view of a silicon-based semiconductor device 100 at an early manufacturing stage. As illustrated, the device 100 may comprise a substrate 101, such as a silicon substrate, an insulating substrate and the like. Moreover, the device 100 may comprise a first silicon-based semiconductor layer 110 and a second silicon-based semiconductor layer 120, which are provided as a stacked configuration. That is, the layer 110 may be formed "above" the layer 120, wherein it should be understood that any positional designations or statements may be referred to the substrate 101. That is, a "lateral" direction is to be understood as a direction extending parallel to a surface 101S of the substrate 101. A "vertical" direction and correlated terms, such as "above," "below," "on" and the like, may refer to a direction that is perpendicular to the surface 101S. In the portion of the semiconductor device 100 as illustrated in FIG. 1a, an optical communication based on monolithically formed opto-electronic components may be established in the semiconductor layer 120, while "electrical" circuit elements may preferably be formed in the semiconductor layer 110. It should be understood, however, that any other "electrical" circuit elements may also be formed in appropriate locations within the semiconductor layer 120 and/or within the substrate 101, if considered appropriate. Moreover, in the example shown, a first buried insulating layer 103 may be formed between the semiconductor layers 110 and 120, while a second buried insulating layer 102 may be positioned between the substrate 101 and the semiconductor layer 120. For instance, the buried insulating layers 103, 102 may be comprised of any appropriate dielectric material, such as silicon dioxide, silicon oxynitride and the like. Consequently, the layers 103 and 102 may have an index of refraction that is less than an index of refraction of the silicon-based layers 110, 120 for a wavelength in the near infrared range. In this case, the buried insulating layers 102, 103 may act as a cladding material of the semiconductor layer 120, which may be considered as the core material of a planar waveguide section. As will be explained later on in more detail, a lateral confinement of light may be accomplished by forming respective trenches in the semiconductor layer 120 and filling these trenches with an appropriate material, such as silicon dioxide and the like, in order to define appropriate waveguide branches or sections in the layer 120.

In other illustrative embodiments, the "layers" 102 and/or 103 may not be provided as continuous material layers but may represent layer portions that may be provided to define a desired optical path on the basis of the semiconductor layer 120. For example, locally restricted strips of insulating material may be provided in order to act as vertical confinements of a corresponding waveguide section in the semiconductor layer 120.

The semiconductor device 100 as illustrated in FIG. 1a may be formed on the basis of the following processes. In some illustrative embodiments, the substrate 101, the buried insulating layer 102 and the semiconductor layer 120 may be provided in the form of a silicon-on-insulator (SOI) substrate, while the silicon layer 110 may be provided in the form of an additional separate substrate, possibly in combination with the layer 103, or at least a portion thereof. Thereafter, the two substrates may be combined by well-established wafer bond techniques, wherein a non-required portion of the additional substrate may be removed, for instance, by wafer cleaving techniques and the like, thereby providing the layer 110 above the substrate 101. Thereafter, any further treatments for improving surface quality and the like may be performed in accordance with well-established process techniques. It should be appreciated that a thickness of the individual layers 110, 103, 120 and 102 may be adjusted on the basis of device requirements, for instance with respect to forming field effect transistors in the layer 110 and forming silicon-based optoelectronic components in the layer 120, while at the same time providing appropriate thickness values for the buried insulating materials 102 and 103.

In other illustrative embodiments, one or both of the layers 103 and 102 may be formed on the basis of ion implantation techniques. For example, the substrate 101, which may be comprised of a crystalline silicon material, and the layer 103 in combination with the semiconductor layer 110 may be provided as an SOI substrate, which may be exposed to an ion implantation process, for instance on the basis of oxygen, so as to incorporate the oxygen species through the layer 103 and through a portion of the substrate 101, which may now represent the layer 120, thereby forming the layer 102 in combination with a corresponding heat treatment. As previously indicated, in this case, any appropriate implantation mask may be provided so as to generate a desired pattern below the semiconductor layer 120, if required. For instance, respective strips or any other patterns of an oxygen-based insulating material may be formed in the layer 102. It should be appreciated that a corresponding technique may also be used for forming the layer 103, if desired. The incorporation of an oxygen species in combination with a corresponding heat treatment is well established in the art and may be efficiently used for obtaining the configuration of the device 100 as shown in FIG. 1a.

Figure 1B:
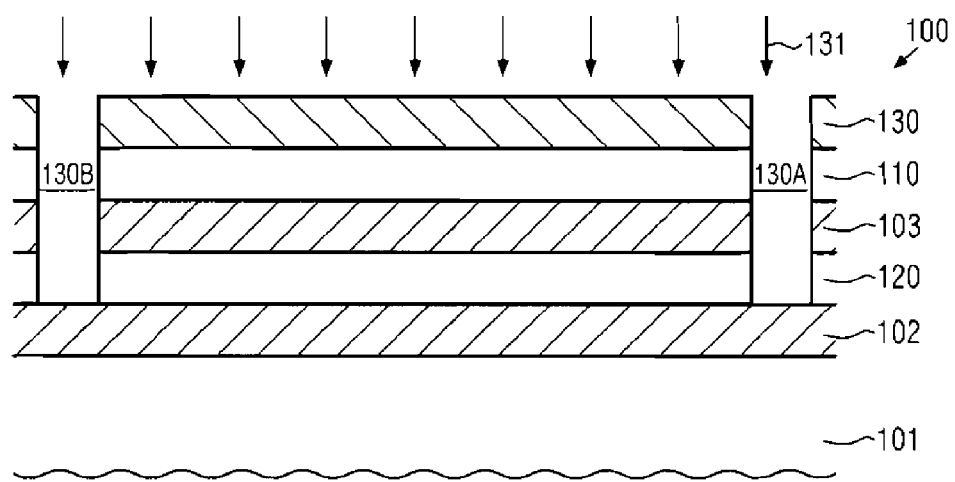

FIG. 1b schematically illustrates the semiconductor device 100 in a further advanced manufacturing stage. As illustrated, the device 100 may comprise an etch mask 130 having openings 130A, 130B in order to define the lateral size and position of a cladding material to be formed in the layer 120 in order to define the lateral dimension and shape of a corresponding waveguide to be formed in the semiconductor layer 120. The etch mask 130 may be formed on the basis of well-established lithography techniques and thereafter an etch sequence 131 may be performed to etch through the semiconductor layer 110, the buried insulating layer 103 and the semiconductor layer 120. For this purpose, well-established anisotropic etch techniques are available and may be applied, wherein the etch chemistry may be appropriately adapted to etch through the different materials. For example, silicon, silicon dioxide and the like may be efficiently etched on the basis of fluorine-based etch chemistries using well-established plasma-assisted recipes.

Figure 1C:
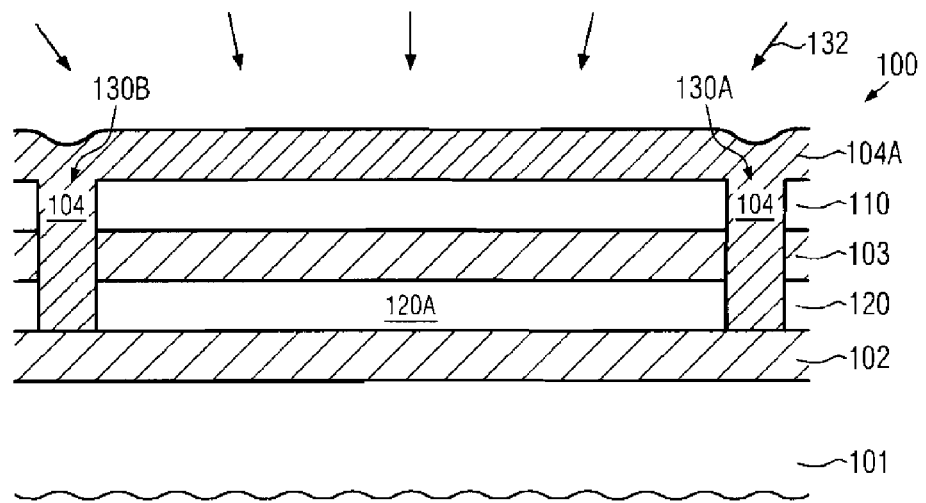

FIG. 1c schematically illustrates the semiconductor device 100 during a deposition process 132 for depositing a material 104A in order to fill the openings 130A, 130B. The material layer 104A may represent any appropriate material, which may act as a cladding material 104 in the openings 130A, 130B so as to laterally confine and thus define a region 120A in the semiconductor layer 120. In one illustrative embodiment, the metallization layer 104A may be comprised of silicon dioxide, which may be deposited on the basis of plasma-assisted chemical vapor deposition (CVD) or thermally-activated CVD techniques in accordance with well-established process recipes. In other cases, other materials, such as silicon-oxynitride, silicon nitride based materials, silicon carbide based materials and the like, may be used, as long as an index of refraction may be less than the index of refraction of the region 120A.

Figure 1D:
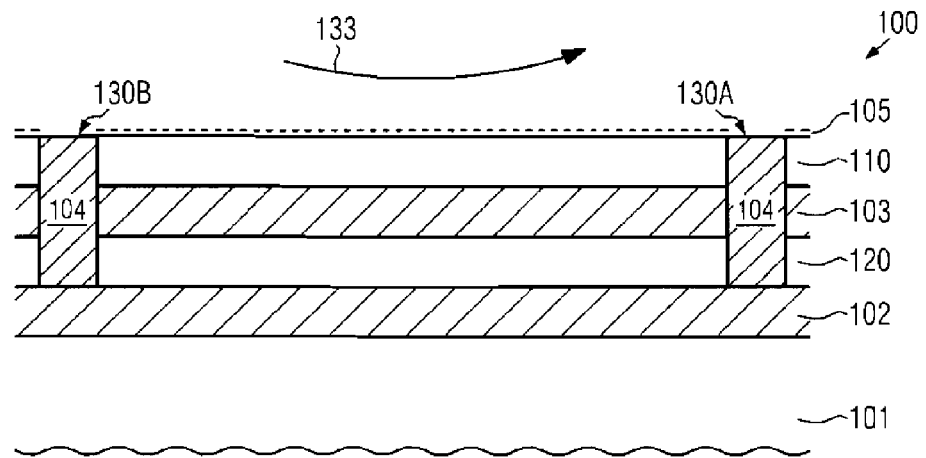

FIG. 1d schematically illustrates the device 100 when subjected to a material removal process 133, which may be applied in the form of a chemical mechanical polishing (CMP) process, in which any excess material of the layer 104A (FIG. 1c) may be removed. As illustrated in FIG. 1d, in some illustrative embodiments, a stop layer 105 may have been provided at an early manufacturing stage, for instance prior to forming the openings 130A, 130B, in order to appropriately control the removal process 133. For example, a silicon nitride material may be used for the layer 105, which may have a higher removal resistivity during the process 133 compared to the material 104. Thereafter, the stop layer 105 may be removed, for instance, by efficient wet chemical etch processes based on hot phosphoric acid and the like.

Figure 1E:
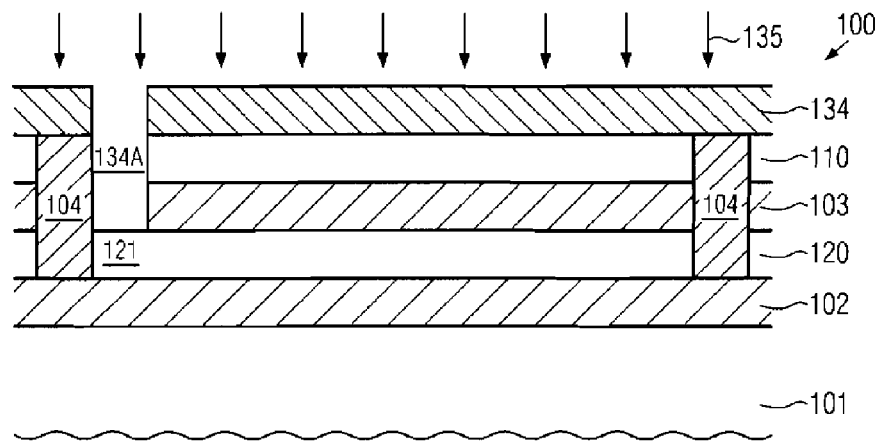

FIG. 1e schematically illustrates the semiconductor device 100 in a further advanced manufacturing stage. As shown, an etch mask 134, such as a resist mask, a hard mask or any combination thereof, may be provided so as to define a lateral size and position of an opto-electronic component to be formed in the semiconductor layer 120. On the basis of the etch mask 134, an etch process 135 is applied to form an opening or trench 134A extending through the layers 110 and 103, thereby exposing a surface of a semiconductor region 121 in the semiconductor layer 120. The etch process 135 may be performed on the basis of any appropriate anisotropic etch technique as is well established in the art. Upon exposing the semiconductor region 121, further processes may be performed to prepare and modify the semiconductor region 121 in any appropriate way to achieve a desired probability of inducing radiative electron-hole recombination events upon initiating a current flow through the semiconductor region 121. For example, based on the mask 134 or based on a newly-applied mask, implantation processes may be performed, for instance, for introducing a boron species with a desired concentration and penetration depth in order to, for instance, create dislocation loops and the like. For example, based on an implantation energy of approximately 20-100 keV with a typical dose of $10^{15}$ cm$^2$, the pre-conditions for obtaining the desired dislocation loops may be established. Furthermore, additional dopant species may be incorporated so as to obtain a PN junction and the like as may be required for the electrical performance of a light-emitting device. Thereafter, any mask materials, such as resist material and the like, may be removed and the further processing may be continued, for instance, on the basis of a specifically designed heat treatment, if specific process conditions are required. In other cases, the heat treatment may be performed in a later manufacturing stage, possibly in combination with heating other circuit elements still to be formed.

Figure 1F:
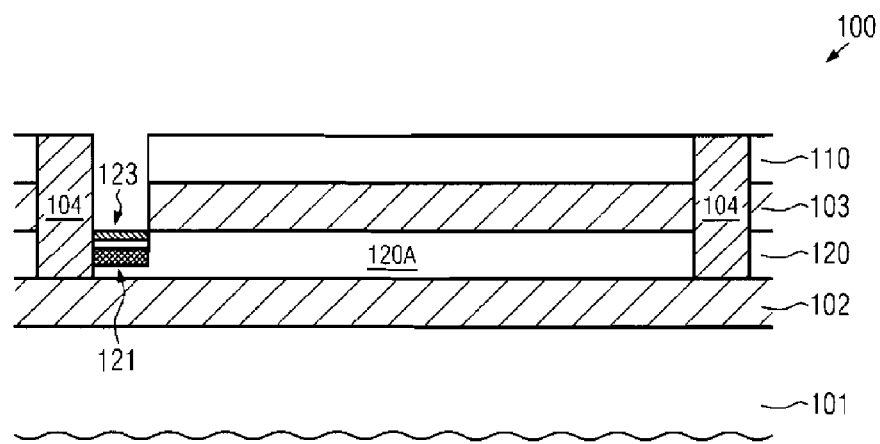

FIG. 1*f* schematically illustrates the semiconductor device 100 with a light-emitting element 123 formed in the semiconductor region 121. In the embodiment shown in FIG. 1*f*, the light-emitting device 123 may represent an edge-emitting device, wherein the light emitted by the device 123 may be directly coupled into the semiconductor region 120A.

Figure 1G:
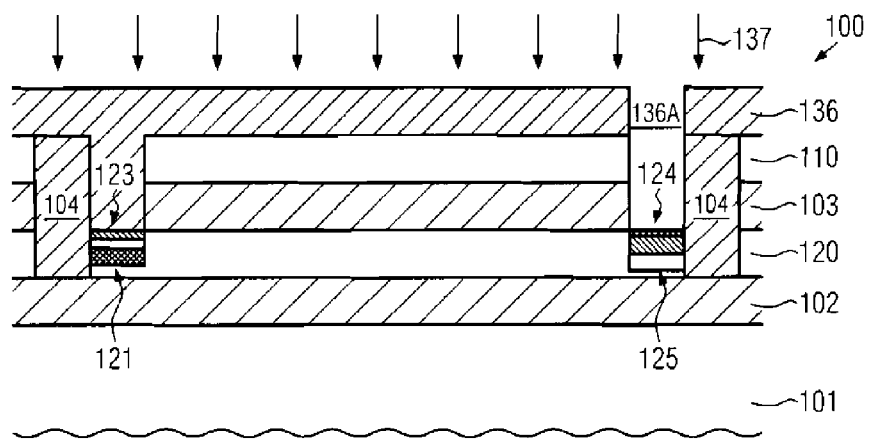

FIG. 1*g* schematically illustrates the semiconductor device 100 in a further advanced manufacturing stage in which an etch mask 136 may be provided to define the lateral position and size of a light-receiving element 124 formed in a second semiconductor region 125 of the semiconductor layer 120. For this purpose, the mask 136 may be provided on the basis of established lithography techniques and an etch process 137 may be performed to etch through the layers 110 and 103. Thereafter, any appropriate process steps, for instance, incorporating a dopant species, incorporating other semiconductor species, such as germanium and the like, may be applied in the form of ion implantation processes, etch processes in combination with selective epitaxial growth techniques, and the like in order to obtain the desired layer configuration that may result in the desired light-receiving capabilities. It should be appreciated that efficient photo sensitive diode structures may be efficiently formed in a silicon-based material on the basis of well-established concepts. It should be appreciated that any process steps for forming the light-receiving element 124 may be accompanied by corresponding masking steps, if required, in combination with any cleaning processes and the like. Furthermore, in some illustrative embodiments, an opening 136A for exposing the semiconductor region 125 and the opening 134A (FIG. 1E) for exposing the semiconductor region 121 may be formed on the basis of a common etch sequence, if considered appropriate for forming the opto-electronic components 123 and 124.

Figure 1H:
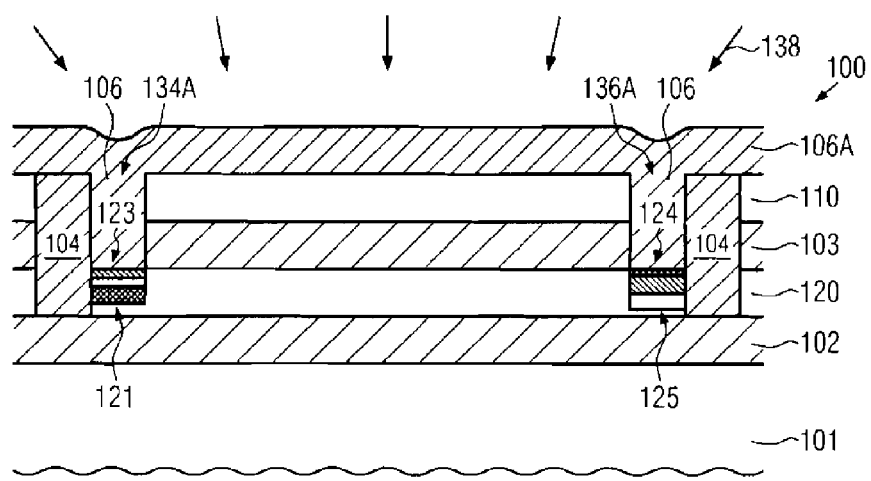

FIG. 1*h* schematically illustrates the semiconductor device 100 in a further advanced manufacturing stage after the removal of the mask 136 (FIG. 1*g*). In this manufacturing phase, a deposition process 138 may be performed to fill the openings 134A and 136A with an appropriate material 106, such as silicon dioxide, silicon oxynitride, silicon nitride and the like. For this purpose, a layer 106A may be formed during the deposition process 138 on the basis of any appropriate deposition technique. Thereafter, any excess material of the layer 106A may be removed, for instance by CMP and the like, wherein a corresponding removal process may be controlled on the basis of a stop layer, which was, for instance, previously explained with reference to FIG. 1*d* when referring to the stop layer 105. That is, in some illustrative embodiments, the stop layer 105 may be provided in an early manufacturing stage and may be maintained throughout the subsequent steps for forming the device 100 as shown in FIG. 1*h* and may thus be re-used as a stop material during the removal of any excess material of the layer 106A. In other cases, prior to patterning the opening 136A, stop material may be deposited and may be used for removing excess material of the layer 106A, if considered appropriate. It should be appreciated that, in this case, the deposition of a corresponding stop material, such as a silicon nitride material, in the opening 134A may not negatively affect the further processing of the device 100.

Figure 1I:
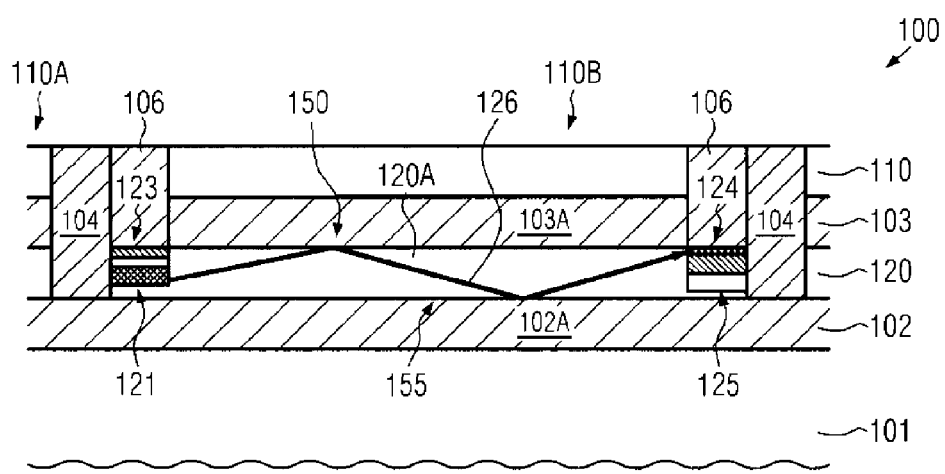

FIG. 1*i* schematically illustrates the semiconductor device 100 after the above-described process sequence. Hence, device 100 may comprise the monolithically implemented opto-electronic components 123, 124, which are embedded in the fill material 104, 106. It should be appreciated that the fill material 104 may further provide for a lateral delineation of the region 120A within the semiconductor layer 120 and may thus act as a "lateral" cladding material for an optical waveguide comprising the semiconductor region 120A as a core material. Moreover, a portion 103A of the buried insulating layer 103 and a portion 102A of the buried insulating layer 102 may act as vertical "cladding" material, thereby providing the vertical confinement of an optical signal 126, which may, upon operation of the device 100, be transmitted by the component 123 and may be received by the component 124. It should be appreciated that the opto-electronic components 123, 124 may be electrically connected to other circuit elements to be formed in the semiconductor layer 110 and/or the semiconductor layer 120, which may be accomplished on the basis of any appropriate interconnect system and/or metallization system still to be formed in the semiconductor device 100. For this purpose, any contact areas (not shown) of the components 123, 124 may be contacted by appropriate contact elements, as will be explained later on in more detail.

It is to be noted that circuit elements of the device 100 may be formed in the semiconductor layer 110, for instance in a region 110A and/or a region 110B, at any appropriate phase that is compatible with the manufacturing sequence as described above in order to provide the opto-electronic components 123, 124 in the semiconductor layer 120. It should be appreciated that the opto-electronic components 123, 124 in combination with an optical path, such as the semiconductor region 120A, may be referred to as an optical communication system 150. In the embodiment shown, the optical path 120A may actually be provided in the form of a waveguide 155 comprising the semiconductor region 120A as a core material, while the materials 103A, 102A and 104 may act as a cladding material, as also previously discussed. Depending on the overall process strategy, the optical communication system 150 may be provided at any appropriate manufacturing stage, for instance prior to forming circuit elements in the semiconductor layer 110, while, in other cases, any such circuit elements may be formed prior to providing the optical communication system 150. For example, the materials for passivating the opto-electronic components 123, 124 may be provided together with any isolation structures to be formed in the semiconductor region 110 in order to define therein appropriate semiconductor regions for circuit elements, such as field effect transistors and the like. In this case, any high temperature processes to be performed during the manufacturing sequence for providing transistor elements may be based on sophisticated anneal techniques, in which a significant rise in temperature may be substantially restricted to the semiconductor material 110, substantially without significantly affecting the components 123, 124. In other cases, any high temperature processes may be appropriately selected such that a desired modification of the components 123, 124 may be accomplished to obtain the desired optical and electrical behavior, while at the same time appropriate dopant profiles may be established in the semiconductor layer 110.

Figure 1J:
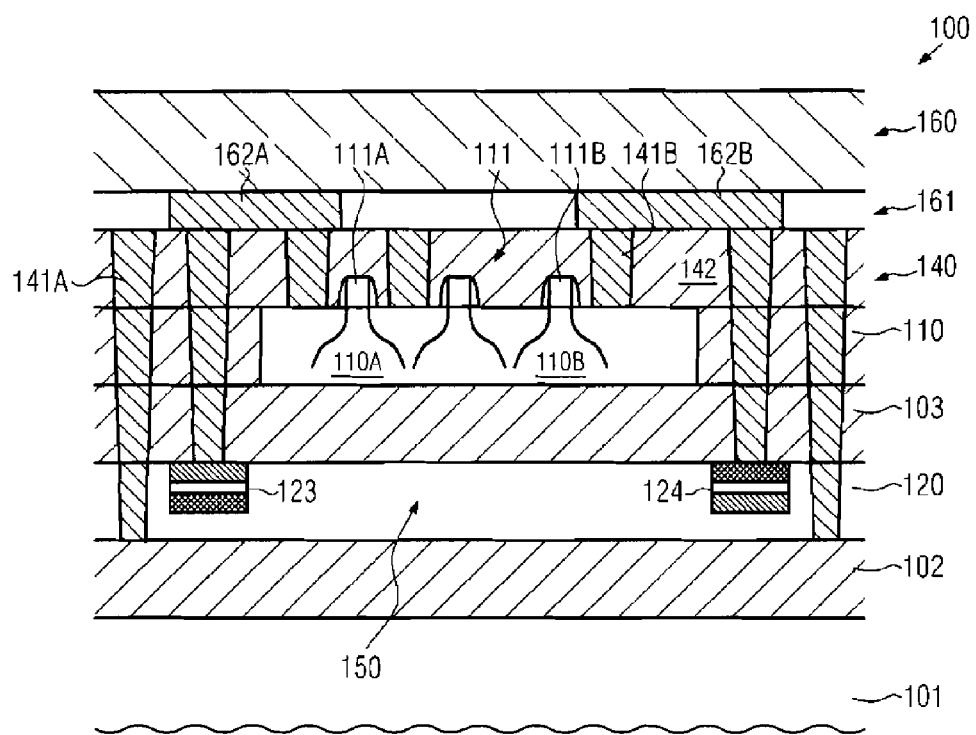

FIG. 1*j* schematically illustrates the semiconductor device 100 in a further advanced manufacturing stage. As illustrated, a plurality of circuit elements 111 may be formed at any appropriate position in and above the semiconductor layer 110. For example, as illustrated, a first circuit element 111A may be formed in and above a first semiconductor region 110A, while a second circuit element 111B may be formed in and above a second semiconductor region 110B. In one illustrative embodiment, the plurality of circuit elements 111 may represent at least a portion of a microprocessor device which may typically include logic circuitry in combination with analog circuits and the like. For instance, the plurality of circuit elements 111 may present speed critical signal paths, wherein a communication between circuit portions or individual circuit elements may be required on the basis of a reduced signal propagation delay. It should be appreciated that the positional distribution of the circuit elements 111 within the semiconductor layer 110 is of illustrative nature only and these circuit elements may typically be distributed across the entire die region of the device 100, wherein, as previously discussed, superior design flexibility may be obtained, since the optical communication system 150 may provide superior signal transmission characteristics, even if communicating circuit portions or circuit elements may be positioned under a moderately "long" distance. By way of example, the first circuit element 111A may provide an electrical signal to be conveyed to the opto-electronic component 123 so as to communicate with the second circuit element 111B without causing significant signal propagation delay. It should be appreciated that a response of the components 123, 124 may be significantly less critical compared to a corresponding electrical signal path to be provided on the basis of a complex conventional metallization system. Moreover, in the manufacturing stage shown, an interconnect system or metallization system 160 may be provided to establish the electrical connections between the circuit elements 111 as required, thereby also connecting the circuit element 111A electrically with the component 123 and connecting the circuit element 111B electrically with the component 124. For this purpose, the system 160 may comprise a plurality of metallization layers, wherein, for convenience, a single metallization layer 161 is illustrated in FIG. 1j. Furthermore, the interconnect system 160 may comprise a contact level 140, which may appropriately connect to the circuit elements 111 and to the components 123, 124 by respective contact elements 141A, 141B. As illustrated, the contact elements 141B may be formed in a dielectric material 142, such as silicon dioxide, silicon nitride and the like, and may extend to any contact areas of the circuit elements 111. Furthermore, the contact element 141B may connect to metal lines 162A, 162B of the metallization layer 161. Moreover, the contact elements 141A may extend through the dielectric material 142 and may also extend through the layers 110 and 103, and if required, through the layer 120. It should be appreciated that the contact elements 141A may be formed so as to be electrically insulated from active portions of the layers 110, 120, if required. For example, corresponding isolation structures may be formed in the layers 110 and 120 if a direct contact with the contact elements 141A has to be avoided. As illustrated by way of example in FIG. 1j, the light-emitting element 123 may be connected via one of the contact elements 141A and the metal line 162A to the circuit element 111A by means of one of the contact elements 141B. Similarly, the circuit element 111B may be connected via one of the elements 141B with the metal line 162B which in turn connects to one of the contact elements 141A that is in contact with the light-receiving element 124. It should be appreciated, however, that the configuration of the interconnect or metallization system 160 including the contact level 140 is of illustrative nature only and may have any other appropriate configuration so as to establish the required electrical connections.

The semiconductor device 100 as illustrated in FIG. 1j may be formed on the basis of the following processes. As previously explained, the plurality of circuit elements 111 may be formed prior to or after forming the optical communication system 150, while, in other cases, some of the required process steps may be performed concurrently with process steps as required for providing the circuit elements 111 in the semiconductor layer 110. For example, after forming the device 100 as shown in FIG. 1h, processes may be performed to provide gate electrode structures of the circuit elements 111, when a complex circuit is considered that is to be realized on the basis of CMOS technology. For this purpose, any appropriate lithography and patterning regimes in combination with material deposition and modification processes may be applied in order to obtain the desired circuit layout based on appropriate design rules. For example, critical dimensions of the circuit elements 111 may be 50 nm and less in sophisticated microprocessor devices. Thereafter, drain and source regions may be formed in the semiconductor layer 110 in accordance with any appropriate process techniques. Thereafter, anneal processes may be performed, wherein, as discussed above, a substantial thermal decoupling may be applied by using sophisticated anneal techniques, if undue elevated temperatures may not be appropriate for the components 123, 124. In other cases, anneal processes may be applied to adjust the characteristics of the circuit elements 111, while at the same time adjusting the final electronic and optical characteristics of the components 123, 124.

In other illustrative embodiments, the optical communication system 150, and in particular, the components 123, 124 may be formed after forming the circuit elements 111 and in particular after performing any high temperature processes, if any heat treatments required for forming the components 123, 124 may be considered to be compatible with the characteristics of the circuit elements 111. Thereafter, the contact level 140 may be formed, for instance, by depositing the dielectric material 142 and patterning the same to form openings for the contact elements 141B and 141A. It should be appreciated that corresponding contact openings for the elements 141A may be formed in two or more steps, if required, thereby relaxing any constraints during a corresponding etch sequence. For example, prior to depositing the material 142, first portions of at least the contact openings may be formed so as to extend through the layers 110, 103 and, if required, through the layer 120, which in some illustrative embodiments may then be filled with an appropriate contact metal, such as tungsten and the like. Thereafter, the material 142 may be deposited and may be patterned to obtain the contact openings for the elements 141B and for the remaining portion of the contact elements 141A. It should be appreciated that, typically, the contact elements 141A may have significantly greater lateral dimensions compared to the contact elements 141B, so that alignment accuracy may be not critical. After filling the contact openings with an appropriate metal and removing any excess material thereof, the further processing may be continued by forming the metallization system 160, which may be accomplished on the basis of any appropriate process techniques. It should be appreciated that the metallization system 160 may have a significantly reduced degree of complexity compared to a metallization system that may have to electrically connect all circuit portions as, for instance, represented by the circuit elements 111A, 111B, in particular, if distant circuit portions have to be connected on the basis of high speed interconnect structures. According to the principles disclosed herein, the interconnect system 160 may be formed in combination with an appropriate layout of the circuit elements 111 such that the opto-electronic component 123 may be provided in close proximity to the circuit element 111A, while the component 124 may be provided in the vicinity of the circuit element 111B, while the optical communication system 150 may provide a reduced signal propagation delay, even if the circuit elements 111A, 111B have to be positioned distant to each other, for instance, in view of thermal design considerations and the like.

Figure 1K:
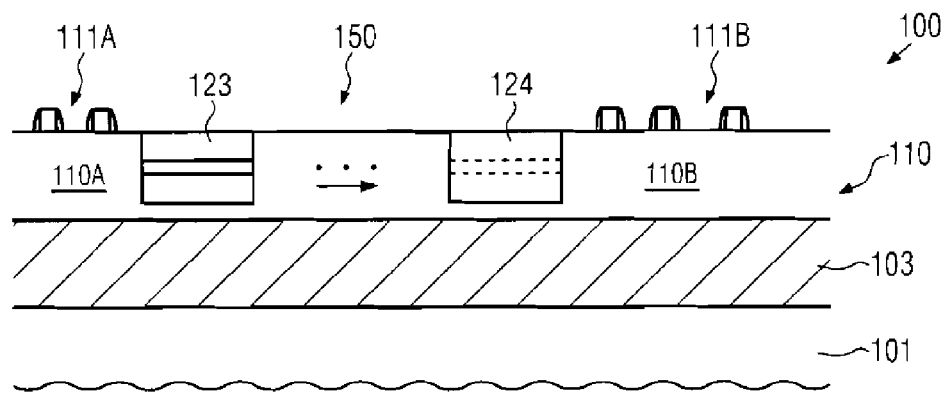
FIG. 1k schematically illustrates a cross-sectional view of the semiconductor device according to further illustrative embodiments, in which an optical signal exchange path may be provided in the same device level as circuit elements of a complex integrated circuit.

FIG. 1*k* schematically illustrates the semiconductor device 100 according to illustrative embodiments in which the optical communication system 150 may be provided in the same level as the circuit elements 111A, 111B. As illustrated, the optical communication system 150, which may have a similar configuration as previously described, may be provided within the semiconductor layer 110 and may be laterally positioned between the semiconductor region 110A and the semiconductor region 110B. In this case, one or more of the circuit elements 111A may be electrically connected to the opto-electronic component 123, while one or more of the circuit elements 111B may be electrically connected to the opto-electronic component 124. For example, the semiconductor regions 110A, 110B may be operated on the basis of different supply voltages, such as moderately high voltage, as, for instance, may be required for power transistors and the like, while the other semiconductor region may be operated on a low voltage, as may typically be required for a control circuit, such as a microprocessor and the like. In this case, signals may be exchanged via the semiconductor regions 110A, 110B without requiring a sophisticated voltage level adaptation, thereby reducing the overall complexity of the device 100. It should be appreciated that the optical system 150 may provide a bi-directional signal exchange, depending on the requirements for operating the device 100. Moreover, with respect to any process techniques for forming the optical communication system 150, similar criteria may apply as previously described. For example, the components 123, 124 may be formed on the basis of a process sequence within the material 110, as previously described, while the buried insulating layer 103 in combination with a dielectric material still to be formed above the semiconductor layer 110 may act as a cladding material, as discussed above. Furthermore, a lateral optical confinement may be established by using an isolation structure, such as a shallow trench isolation, which may also be used for separating various device regions in the semiconductor layer 110, as is also discussed above.

Figure 1L:
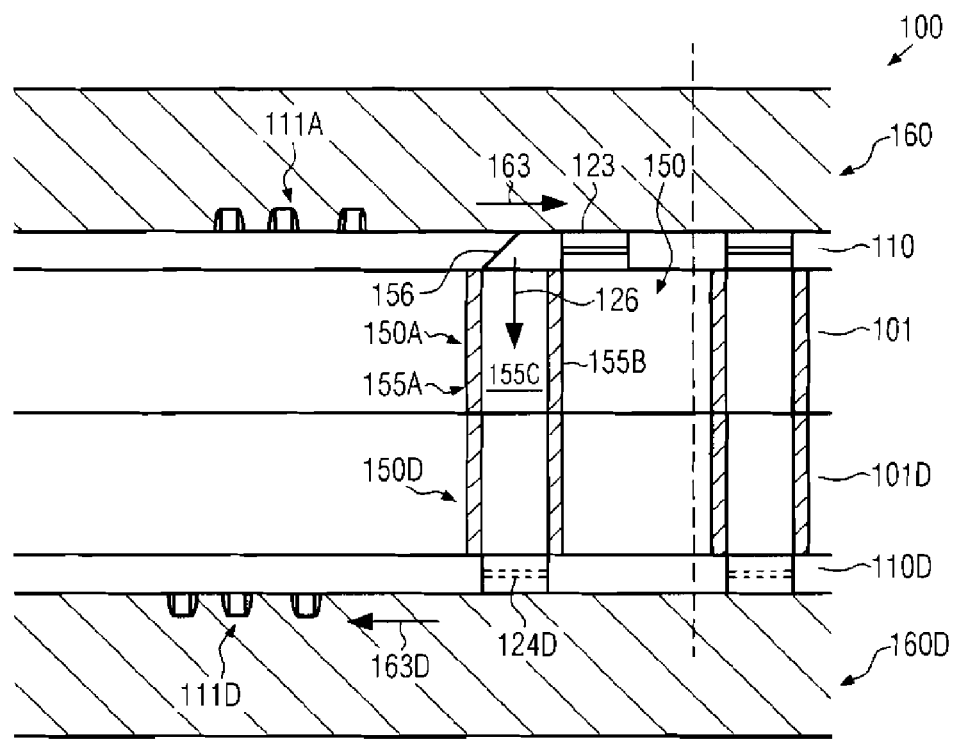
FIG. 1l schematically illustrates a cross-sectional view of a three-dimensional chip configuration, in which an inter-chip communication may at least be partially accomplished on the basis of waveguides and monolithic silicon-based opto-electronic components.

FIG. 1*l* schematically illustrates the semiconductor device 100 according to further illustrative embodiments in which the optical system 150 may be used for signal exchange in a three-dimensional device configuration. As illustrated, the device may comprise a substrate 101 with the semiconductor layer 110, which may comprise the circuit element 111A in combination with the interconnect system or metallization system 160. Moreover, in the embodiment shown, the opto-electronic component 123 may be formed in the layer 110, while in other cases (not shown) an additional semiconductor layer may be provided in the substrate 101, as is, for instance, illustrated in FIG. 1*j*, so as to accommodate the component 123. Moreover, the optical system 150 may comprise a first part 150A including a waveguide portion 155A comprising a core material 155C, such as a semiconductor material of the substrate 101, in combination with a cladding material 155B, for instance in the form of silicon dioxide and the like. Thus, the cladding material 155B may represent a trench extending through the substrate 101 and which may laterally represent a "closed" configuration so as to completely enclose the core material 155C. Moreover, if required, the system 150A may comprise a deflecting area 156 so as to deflect a light beam 126 from the generally horizontal direction within the layer 110 into a generally vertical direction. For this purpose, an appropriate optical system, such as a Bragg grating and the like, may be used. In other cases, as indicated, at the right hand side by the dashed line, the optical communication system 150 may comprise a component 123 as a surface emitting element, which may be configured to directly emit into the waveguide portion 150A.

Moreover, the device 100 may comprise a further semiconductor chip based on a substrate 101D "above" which may be formed a semiconductor layer 110D, in and above which may be formed circuit elements 111D. Moreover, a metallization system 160D may provide electrical connections between the circuit elements 111D and may connect one or more circuit elements with an opto-electronic component 124D, which may be provided in the semiconductor layer 110D or within any semiconductor material within the substrate 101D, which was also previously discussed. Furthermore, a part of the optical communication system 150, indicated as 150D, may also be provided in the substrate 101D and may be optically connected to the component 124D, wherein a corresponding configuration may be substantially identical to the portion 150A with respect to the light-guiding components. Consequently, the circuit element 111A may be electrically coupled to the component 123, as indicated by electrical signal 163, in order to provide the optical signal 126, which in turn may be converted into an electrical signal 163D that may be connected to one or more of the circuit elements 111D by the interconnect structure 160D. It should be appreciated that also in this case the optical system 150 may be appropriately configured so as to provide a bi-directional optical signal exchange, if required.

The semiconductor device 100 as illustrated in FIG. 1*l* may be formed on the basis of the following processes. Generally, the substrates 101 and 101D may be processed in separate process sequences in order to obtain the desired configuration of the circuit elements 111A, 111D, while the portions 150A, 150D of the optical system 150 may be formed so as to be connected to each other during a further advanced manufacturing stage. For example, prior to or after forming the circuit elements 111A above the substrate 101, the waveguide portion 155A may be formed, for instance, by etching a trench into the substrate 101 and refilling the trench with an appropriate material, such as silicon dioxide, wherein corresponding lateral sidewalls may be etched and filled subsequently, if required. In other cases, through-holes may be formed in the substrate 101 and the through-holes may be coated with an appropriate material, such as silicon dioxide, for instance on the basis of a backside etching process and a deposition process, after which any silicon dioxide material at a "bottom" of the opening may be removed by an anisotropic etch process. Thereafter, silicon material may be deposited by any appropriate deposition technique, thereby forming the core material 155C. It should be appreciated that the portion 150D in the substrate 101D may be formed on the basis of similar process techniques. Thereafter, the substrates 101 and 101D may be attached to each other on the basis of, for instance, any appropriate process technique, such as wafer bonding, gluing and the like, not without unduly compromising the optical behavior of the composite waveguide of the system 150. Consequently, a very efficient signal exchange between the circuit elements 111A and 111B may be accomplished via the optical communication system 150, wherein the required opto-electronic components 123, 124 may readily be implemented in a silicon-based semiconductor material.

As a result, the present disclosure provides semiconductor devices and manufacturing techniques in which optical signal transfer capabilities may be implemented in silicon-based complex circuits so as to provide a chip-internal communication system or a device-internal communication system in three-dimensional stacked chip configurations. For this purpose, silicon-based opto-electronic components will be provided in combination with an appropriate optical path, for instance based on buried insulating materials, thereby enhancing design flexibility, reducing constraints in terms of heat dissipation and providing superior performance.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
    a first circuit element formed in and above a first silicon-containing semiconductor layer;
    a second circuit element formed in and above said first silicon-containing semiconductor layer;
    a second silicon-containing semiconductor layer positioned below said first silicon containing semiconductor layer;
    a first vertical cladding material layer comprised of a dielectric material positioned above and on said second silicon-containing semiconductor layer;
    a second vertical cladding material layer comprised of a dielectric material positioned below and on said second silicon-containing semiconductor layer;
    a first lateral cladding material layer that is positioned in at least said second silicon-containing semiconductor layer, wherein said first and second vertical cladding materials and said first lateral cladding material define an optical waveguide structure comprised of a portion of said second silicon-containing semiconductor layer, a lateral dimension of said optical waveguide structure being defined by said first lateral cladding material layer;
    a light-emitting element formed in said optical waveguide structure;
    a light-receiving element formed in said optical waveguide structure, said light-receiving element being configured and arranged to receive light from said light-emitting element traveling within said optical waveguide structure; and
    an interconnect structure configured to electrically connect said light-emitting element with said first circuit element and to electrically connect said light-receiving element with said second circuit element.

2. The semiconductor device of claim 1, wherein at least one of said first and second circuit elements is part of a circuit portion of a microprocessor.

3. The semiconductor device of claim 1, wherein said first and second vertical cladding materials and said first lateral cladding material enclose said optical waveguide structure.

4. A semiconductor device, comprising:
    a plurality of circuit elements formed in and above a first silicon-containing semiconductor layer;
    a light-emitting element formed in a second silicon-containing semiconductor layer, said first silicon-containing semiconductor layer being formed above said second silicon-containing semiconductor layer;
    a light-receiving element formed in said second silicon-containing semiconductor layer;
    a first buried cladding layer formed between said first and second silicon-containing semiconductor layers;
    a second buried cladding layer formed below said second silicon-containing semiconductor layer; and
    an interconnect system configured to electrically connect said light-emitting element and said light-receiving element to said plurality of circuit elements.

5. The semiconductor device of claim 4, wherein said plurality of circuit elements represent at least a portion of a microprocessor.

6. The semiconductor device of claim 4, further comprising a waveguide formed in said second silicon-containing semiconductor layer, wherein said first and second cladding layers represent a portion of a cladding of said waveguide.

7. The semiconductor device of claim 6, wherein said cladding comprises lateral cladding portions formed in said second silicon-containing semiconductor layer.

8. The semiconductor device of claim 6, wherein said cladding comprises a dielectric material.

9. The semiconductor device of claim 8, wherein said dielectric material comprises silicon dioxide.

10. A semiconductor device, comprising:
    a plurality of circuit elements formed in and above a first silicon-containing semiconductor layer;
    a second silicon-containing semiconductor layer positioned below said first silicon-containing semiconductor layer;
    an enclosed optical waveguide structure defined in a portion of said second silicon-containing structure, said enclosed optical waveguide structure being defined by:
        a first buried cladding layer formed between said first and second silicon-containing semiconductor layers;
        a second buried cladding layer formed below said second silicon-containing semiconductor layer; and
        a third cladding layer that is positioned at least in said second silicon-containing semiconductor layer;
    a light-emitting element positioned in said enclosed optical waveguide structure;
    a light-receiving element positioned in said enclosed optical waveguide structure; and
    an interconnect system configured to electrically connect said light-emitting element and said light-receiving element to said plurality of circuit elements.

11. The semiconductor device of claim 10, wherein a lateral width of said enclosed optical waveguide structure is defined by said third cladding layer.

12. The semiconductor device of claim 10, wherein said first buried cladding layer, said second buried cladding layer and said third cladding layer comprises a dielectric material.

13. The semiconductor device of claim 12, wherein said dielectric material comprises silicon dioxide.

14. The method of claim 10, wherein said first and second circuit elements represent a portion of a microprocessor.

15. A method of forming a silicon-based semiconductor device in a structure comprised of a first silicon-containing semiconductor layer positioned between first and second layers of dielectric material, said first layer of dielectric material being positioned below said first silicon-containing semiconductor layer, and a second silicon-containing semiconductor layer positioned on an upper surface of said second layer of dielectric material, the method comprising:

forming cladding material opening that extends at least through said first and second silicon-containing semiconductor layers and said second layer of dielectric material;

filling said cladding material opening with a dielectric cladding material so as to define a lateral width of an optical waveguide structure comprised of a portion of said first silicon-containing semiconductor layer;

forming a light-emitting element and a light-receiving element in said optical waveguide structure, wherein said light-receiving element is adapted to receive light from said light-emitting element traveling within said optical waveguide structure; and forming first and second circuit elements in and above said second silicon-containing semiconductor layer; and forming an interconnect structure configured to electrically connect said light-emitting element with said first circuit element and to electrically connect said light-receiving element with said second circuit element.

16. The method of claim 15, wherein said optical waveguide structure is enclosed by said first and second layers of dielectric material and said dielectric cladding material positioned within said dielectric cladding material.

17. The method of claim 15, wherein said first and second layers of dielectric material and said dielectric cladding material positioned within said dielectric cladding material all have an index of refraction that is less than an index of refraction of material of said first silicon-containing semiconductor layer.

* * * * *